United States Patent
Kim

(10) Patent No.: US 9,409,203 B2
(45) Date of Patent: Aug. 9, 2016

(54) DEVICE FOR MANUFACTURE INCLUDING A DEPOSITION MASK

(71) Applicant: SAMSUNG DISPLAY CO., LTD., Yongin-si, Gyeonggi-do (KR)

(72) Inventor: Yong-Hwan Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 267 days.

(21) Appl. No.: 13/712,912

(22) Filed: Dec. 12, 2012

(65) Prior Publication Data
US 2013/0199443 A1    Aug. 8, 2013

(30) Foreign Application Priority Data
Feb. 3, 2012   (KR) .................. 10-2012-0011423

(51) Int. Cl.
| | |
|---|---|
| *B05C 21/00* | (2006.01) |
| *B05B 15/04* | (2006.01) |
| *C23C 14/04* | (2006.01) |
| *C23C 16/04* | (2006.01) |
| *H01L 51/56* | (2006.01) |

(52) U.S. Cl.
CPC ............ *B05C 21/005* (2013.01); *B05B 15/045* (2013.01); *C23C 14/042* (2013.01); *C23C 16/042* (2013.01); *H01L 51/56* (2013.01)

(58) Field of Classification Search
None
See application file for complete search history.

(56) References Cited

U.S. PATENT DOCUMENTS

| | | |
|---|---|---|
| 2004/0020435 A1 | 2/2004 | Tsuchiya et al. |
| 2004/0163592 A1 | 8/2004 | Abiko et al. |
| 2007/0148337 A1* | 6/2007 | Nichols et al. .............. 427/98.4 |

FOREIGN PATENT DOCUMENTS

| | | | |
|---|---|---|---|
| CN | 1480011 A | 3/2004 | |
| CN | 1542160 A | 11/2004 | |
| CN | 101001972 A | 7/2007 | |
| JP | 2005-139493 | * 6/2005 | ............. C23C 14/04 |
| JP | 2005-139493 A | 6/2005 | |
| KR | 10-1997-0043140 | 8/2000 | |
| KR | 10-2006-0104287 A | 10/2006 | |
| KR | 10-0774289 | 11/2007 | |
| KR | 10-2009-0052203 A | 5/2009 | |
| KR | 10-2009-0123590 A | 12/2009 | |

OTHER PUBLICATIONS

Korean Patent Abstracts No. 10-0262881 B1 for Patent No. KR 10-1997-0043140, 2 pages.
Korean Patent Abstracts No. 10-2007-0051626 A for Patent No. KR 10-0774289, 2 pages.
SIPO Office action dated Feb. 29, 2016, for corresponding Chinese Patent application 201310041989.6, (7 pages).

* cited by examiner

*Primary Examiner* — Dah-Wei D Yuan
*Assistant Examiner* — Jethro M Pence
(74) *Attorney, Agent, or Firm* — Lewis Roca Rothgerber Christie LLP

(57) ABSTRACT

A device for manufacture including a deposition mask includes a clamper for fixing an end of a divided mask sheet and having a pin hole, a clamping pin in the clamper for being inserted into the pin hole, and an elevator for elevating the clamping pin.

8 Claims, 5 Drawing Sheets

DEVICE FOR MANUFACTURE INCLUDING A DEPOSITION MASK

RELATED APPLICATIONS

This application claims priority to and the benefit of Korean Patent Application No. 10-2012-0011423 filed in the Korean Intellectual Property Office on Feb. 3, 2012, the entire content of which is incorporated herein by reference.

BACKGROUND

1. Field

The described technology relates generally to a device for manufacture including a deposition mask.

2. Description of the Related Art

An organic light emitting diode (OLED) display includes two electrodes and an organic emission layer therebetween. Electrons injected from one electrode and holes injected from the other electrode are coupled with each other at the organic emission layer to form excitons, and the excitons emit light while emitting energy.

To form the organic emission layer, an organic material must be deposited on a substrate, and to achieve this, a deposition source filled with the organic material is heated to evaporate the organic material and spray the same over the substrate. In this instance, to deposit the evaporated and sprayed organic material with a specific pattern, an opening is formed corresponding to a specific position to deposit it, and a deposition mask made of a metallic material is used for a remaining position. The deposition mask is classified as a divided mask or a non-divided mask, according to the manufacturing method. The divided mask is used by pulling both ends of a mask sheet that is divided per cell by using a clamper installed at both ends of a manufacturing device to apply a tension force to the mask sheet, and welding it to the mask frame. The non-divided mask, which is a conventional mask, is used by pulling a mother mask that is not divided by using clampers installed at four corners of the manufacturing device to apply the tension force to the mother mask, and welding it to the mask frame.

Particularly, the division method allows good selection, and is easy to repair, so the division method is widely applied to mass production. However, the divided mask combines both ends of the divided mask sheet with the clamper, and applies a tension force thereto, so both ends of the divided mask sheet may be wrinkled. This is because, when a thin-film divided mask sheet is clamped, the thin-film divided mask sheet might not withstand the clamping force of the clamper, so wrinkles may be generated at both the ends of the divided mask. The clamping force may be weakened to stop the generation of wrinkles, but in that case, accurate tension force might not be applied and the clamping may be loose.

Also, when a wrinkle is generated in the length direction of the divided mask sheet, it may be removed by applying the tension force to both ends of the divided mask sheet and clamping the same, and when the wrinkle is already generated in the width direction of the divided mask sheet, the wrinkle might not be removed when the tension force is applied to both ends of the divided mask sheet.

Further, the divided mask sheet may be fixed by vacuum in the stage before it is loaded to a mask frame, and a position of the divided mask sheet may be changed while the clamper clamps the divided mask sheet, so that one or both ends of the divided mask sheet might not be clamped at an accurate position.

The above information disclosed in this Background section is only for enhancement of understanding of the background of the described technology and therefore it may contain information that does not form the prior art that is already known in this country to a person of ordinary skill in the art.

SUMMARY

Embodiments of the present invention provide a device for manufacture including a deposition mask for reducing or preventing the generation of wrinkles in a divided mask sheet during clamping, and controlling or avoiding mis-clamping (e.g., erroneous clamping).

An exemplary embodiment of the present invention provides a device for manufacture including a deposition mask, the device including a clamper for fixing an end of a divided mask sheet and having a pin hole, a clamping pin in the clamper for being inserted into the pin hole, and an elevator for elevating the clamping pin.

The clamper may include a top clamper for contacting a top side of the end of the divided mask sheet, and a bottom clamper for contacting a bottom side of the end of the divided mask sheet and having a suction groove for affixing the end of the divided mask sheet at the bottom clamper.

The clamping pin may be in the suction groove.

An elevating hole for elevating the clamping pin may be at the bottom clamper.

An inserting groove for receiving the clamping pin may be at the top clamper.

The elevator may be coupled to the clamping pin via the elevating hole.

The suction groove may be coupled to a vacuum for affixing the end of the divided mask sheet.

The deposition mask may include a plurality of the divided mask sheets.

According to the present embodiment, the suction groove and the clamping pin may be installed in the clamper for fixing the divided mask sheet so the divided mask sheet may be clamped while it is unwrinkled to be flat before it is loaded to the mask frame. Therefore, the wrinkles and the mis-clamping phenomenon occurring during clamping the divided mask sheet may be eliminated.

Also, the divided mask sheet is extended in four oblique directions so that the wrinkles of the divided mask sheet in its width direction may be removed.

DETAILED DESCRIPTION

Figure 1:
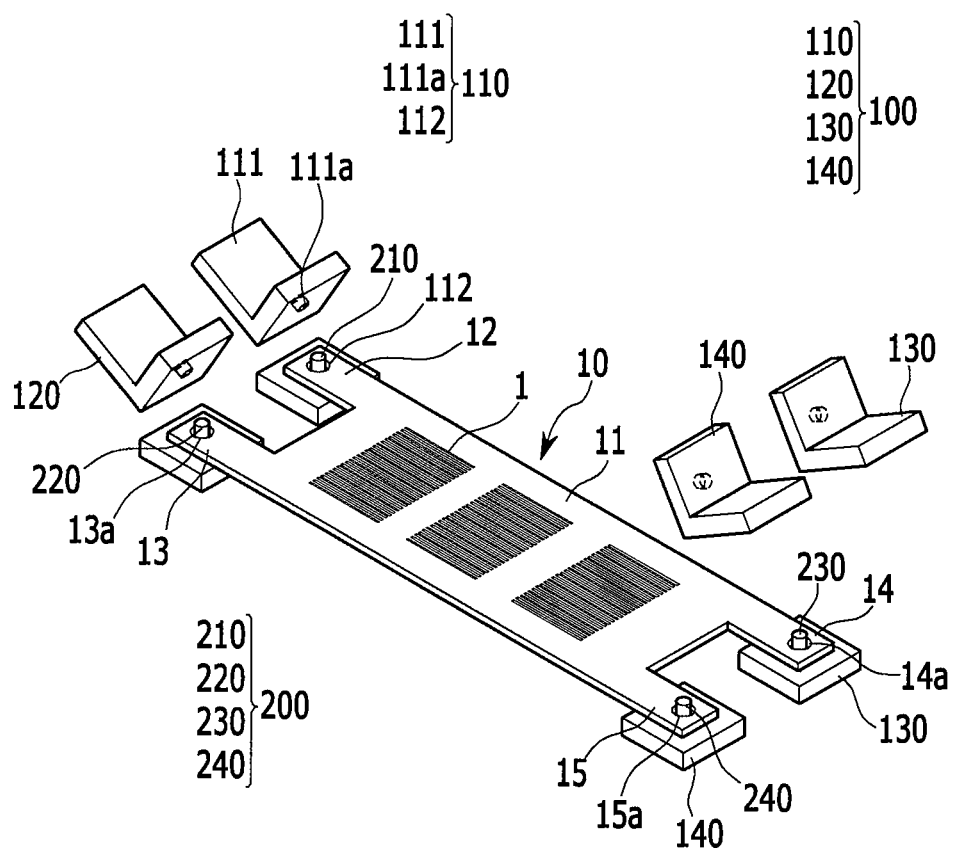
FIG. 1 shows a perspective view of a divided mask sheet and a device for manufacture including a deposition mask, according to an exemplary embodiment of the present invention.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Like reference numerals designate like elements throughout the specification.

Furthermore, as the size and thickness of the respective structural components shown in the drawings may be arbitrarily illustrated for explanatory convenience, the present invention is not necessarily limited to the proportions as illustrated.

A deposition mask according to an exemplary embodiment of the present invention will now be described in detail with reference to FIG. 1 to FIG. 5.

Figure 2:
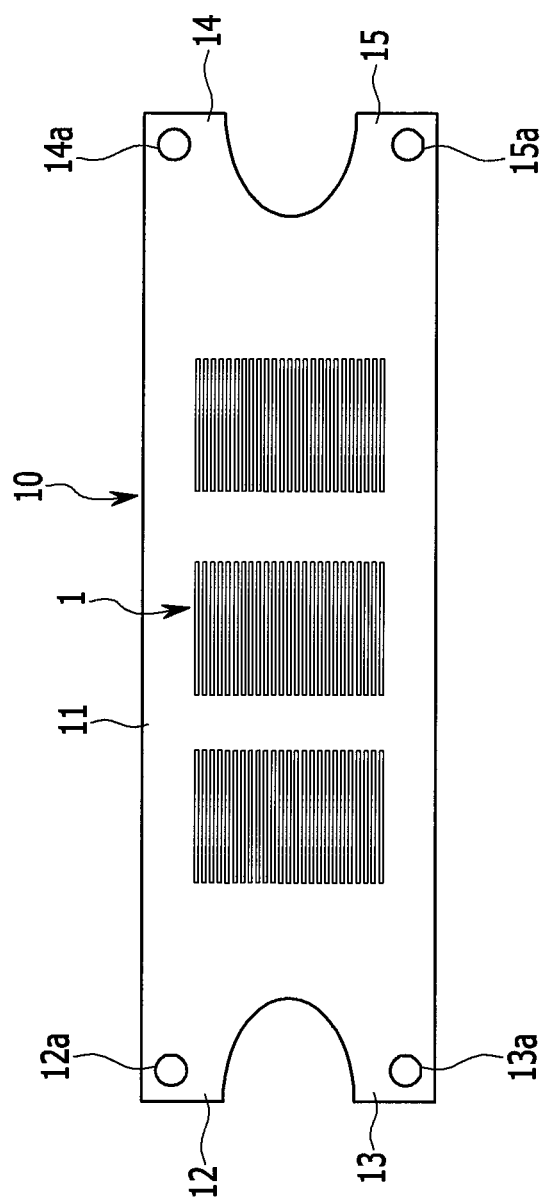
FIG. 2 shows a top plan view of a divided mask sheet corresponding to a device for manufacture including a deposition mask according to an exemplary embodiment of the present invention.
Figure 3:
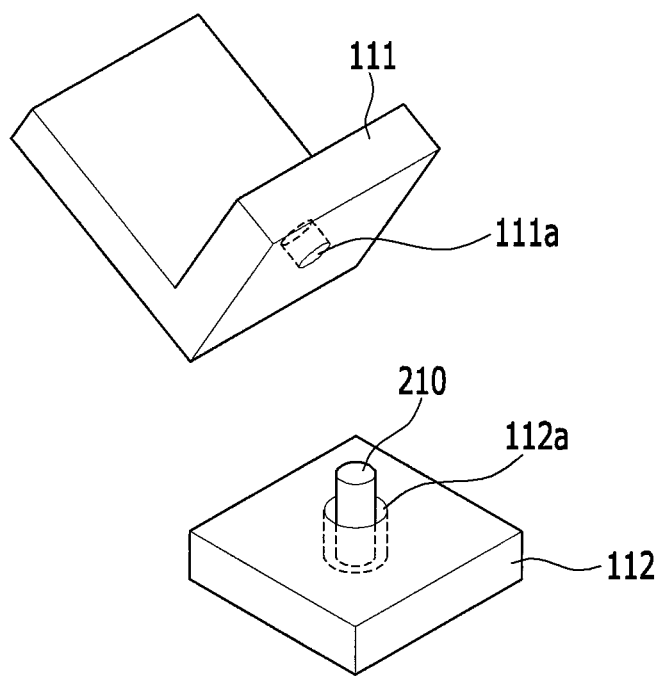
FIG. 3 shows a perspective view of a clamper of a device for manufacture including a deposition mask according to an exemplary embodiment of the present invention.
Figure 4:
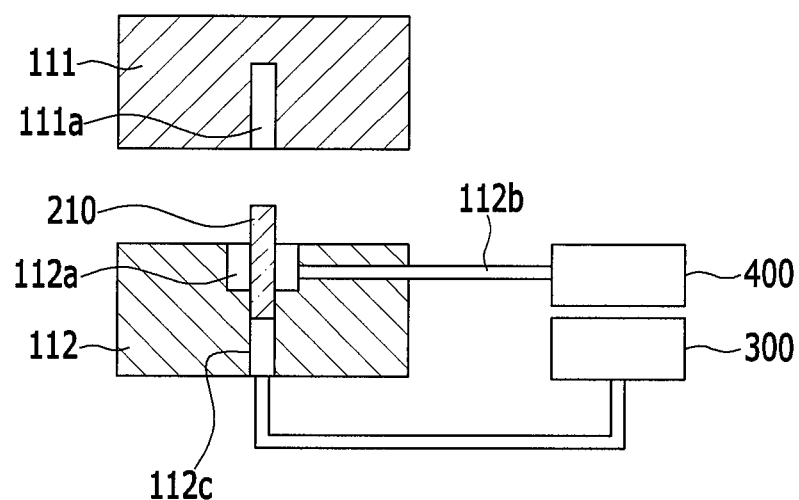
FIG. 4 shows a cross-sectional view of a device for manufacture including a deposition mask according to an exemplary embodiment of the present invention.

FIG. 1 shows a perspective view of a divided mask sheet and a device for manufacture including a deposition mask according to an exemplary embodiment of the present invention, FIG. 2 shows a top plan view of a divided mask sheet corresponding to a device for manufacture including a deposition mask according to an exemplary embodiment of the present invention, FIG. 3 shows a perspective view of a clamper of a device for manufacture including a deposition mask according to an exemplary embodiment of the present invention, and FIG. 4 shows a cross-sectional view of a device for manufacture including a deposition mask according to an exemplary embodiment of the present invention.

In the exemplary embodiment of the present invention, the deposition mask may include a plurality of divided mask sheets.

As shown in FIG. 1 to FIG. 4, the device for manufacture including a deposition mask of the present embodiment includes a plurality of clampers 100 for fixing an end(s) of a divided mask sheet 10 on which pin holes (12a, 13a, 14a, 15a) are formed, a clamping pin 200 corresponding to each of the clampers 100 and inserted into the pin holes (12a, 13a, 14a, 15a), and an elevator 300 for elevating the clamping pin 200.

The divided mask sheet 10 includes a mask main body 11 on which a mask pattern 1 is formed, a left top unit 12 extending from a left top of the mask main body 11, a left bottom unit 13 extending from a left bottom of the mask main body 11 and distanced from the left top unit 12, a right top unit 14 extending from a right top of the mask main body 11, and a right bottom unit 15 extending from a right bottom of the mask main body 11 and distanced from the right top unit 14. The pin holes (12a, 13a, 14a, 15a) are respectively formed on the left top unit 12, the left bottom unit 13, the right top unit 14, and the right bottom unit 15.

The plurality of clampers 100 include a left top unit clamper 110 for fixing the left top unit 12 of the divided mask sheet 10, a left bottom clamper 120 for fixing the left bottom unit 13, a right top clamper 130 for fixing the right top unit 14, and a right bottom clamper 140 for fixing the right bottom unit 15.

The clampers (110, 120, 130, 140) enable the application of a tension force to the divided mask sheet 10 in four directions, and fix the divided mask sheet 10 to reduce or eliminate the generation of wrinkles in the divided mask sheet 10.

The left top unit clamper 110 from among the four clampers (110, 120, 130, 140) will now be described, and as the three clampers 120, 130, and 140 have configurations that are substantially equivalent to those of the left top unit clamper 110, only the left top unit clamp 110 will be described.

The left top unit clamper 110 includes a top clamper 111 contacting a top side of the left top unit 12 of the divided mask sheet 10, and a bottom clamper 112 contacting a bottom side of the left top unit 12 of the divided mask sheet 10.

An absorbing groove (e.g., a suction groove) 112a for absorbing the left top unit 12 of the divided mask sheet 10 is formed on the bottom clamper 112. The absorbing groove 112a is coupled to a vacuum device 400 for creating a vacuum through a vacuum tube 112b formed on, or coupled to, an interior wall of the absorbing groove 112a.

The divided mask sheet 10 is loaded to the clamper 100 (e.g., the left top unit clamper 110) in a flat manner by using the absorbing groove 112a, and absorbing and fixing the left top unit 12 of the divided mask sheet 10, thereby controlling, or avoiding, the generation of wrinkles in the divided mask sheet 10 during clamping, and reducing the effects of, or eliminating altogether, the mis-clamping phenomenon.

A clamping pin 210 is provided in the absorbing groove 112a. The clamping pin 210 is inserted into the pin hole 12a formed on the left top unit 12 of the divided mask sheet 10 to fix the divided mask sheet 10. An inserting groove 111a into which the clamping pin 210 may be inserted is formed on the top clamper 111.

Figure 5:
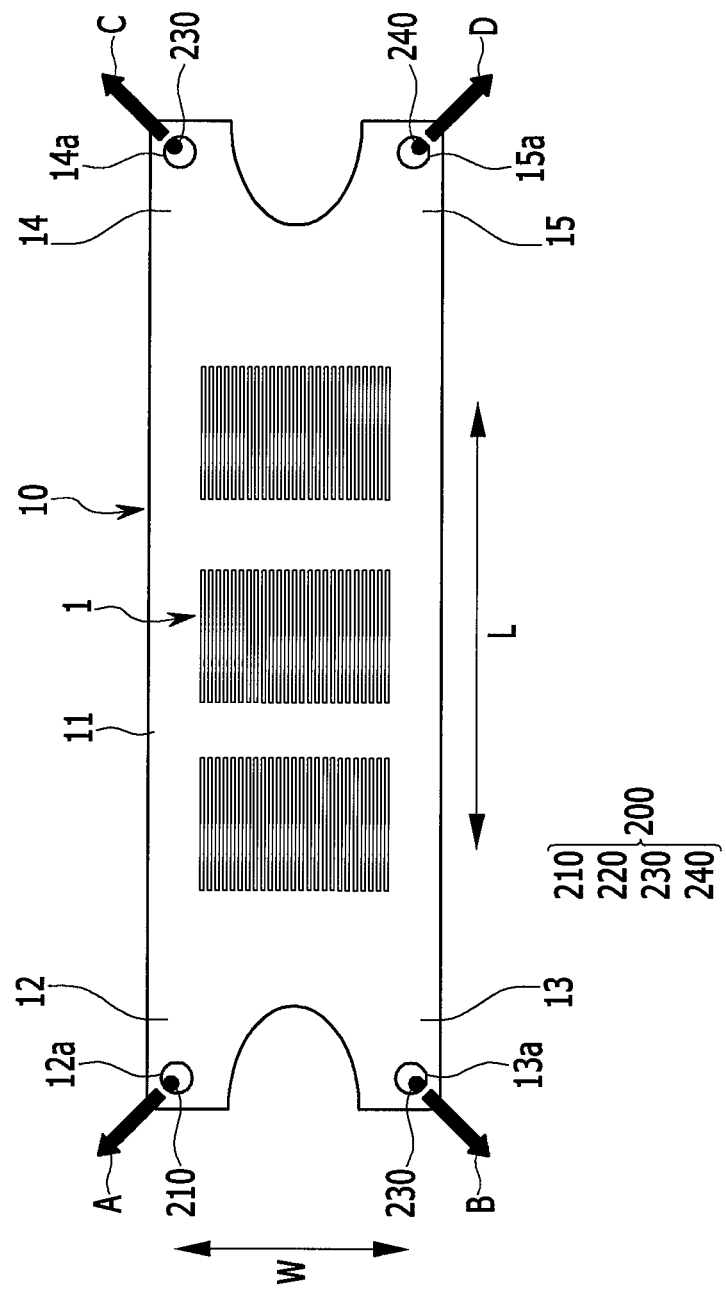
FIG. 5 shows a method for removing a wrinkle on a divided mask sheet by using a device for manufacture including a deposition mask according to an exemplary embodiment of the present invention.

FIG. 5 shows a method for removing a wrinkle on a divided mask sheet by using a device for manufacture including a deposition mask according to an exemplary embodiment of the present invention.

As shown in FIG. 5, clamping pins (210, 220, 230, 240) are inserted into the pin holes (12a, 13a, 14a, 14a) respectively formed on the left top unit 12, the left bottom unit 13, the right top unit 14, and the right bottom unit 15 of the divided mask sheet 10, and the clamping pins (210, 220, 230, 240) are in an oblique direction (e.g., A, B, C, D) with respect to the pin holes (12a, 13a, 14a, 14a). That is, the clamping pin 210 inserted into the pin hole 12a formed on the left top unit 12 of the divided mask sheet 10 is on the left top inside the pin hole 12a, the clamping pin 220 inserted into the pin hole 13a formed on the left bottom unit 13 of the divided mask sheet 10 is on the left bottom inside the pin hole 13a, the clamping pin 230 inserted into the pin hole 14a formed on the right top unit 14 of the divided mask sheet 10 is on the right top inside the pin hole 14a, and the clamping pin 240 inserted into the pin hole 15a formed on the right bottom unit 15 of the divided mask sheet 10 is on the right bottom inside the pin hole 15a.

Therefore, the clamping pins (210, 220, 230, 240) extend the divided mask sheet 10 in four oblique directions (A, B, C, D) so the divided mask sheet 10 is pulled in a length direction (L) and a width direction (W) of the divided mask sheet 10 to reduce or eliminate the generation of wrinkles in the divided mask sheet 10.

Accordingly, the wrinkles that are generated before the divided mask sheet 10 is loaded to the mask frame are reduced or eliminated by using the clamping pins (210, 220, 230, 240), and the divided mask sheet 10 is clamped while the divided mask sheet 10 is substantially unwrinkled, thereby efficiently reducing or removing the wrinkles that may be generated during the clamping process.

Further, the divided mask sheet 10 is extended in four oblique directions by using the clamping pins (210, 220, 230, 240) so the wrinkles in the width direction (W) of the divided mask sheet 10 are reduced or removed.

An elevating hole 112c through which the clamping pin 210 may be elevated is formed in the bottom clamper 112. The elevating hole 112c is formed on a bottom side of the absorbing groove 112a.

The elevator 300 is coupled to the clamping pin 210 through the elevating hole 112c, and it may elevate the clamping pin 210 by using the elevator 300. The elevator 300 of the present embodiment includes a compressor.

When the divided mask sheet 10 is thick or the wrinkle of the divided mask is small, it is undesirable to use the clamping pin so the divided mask sheet 10 may be fixed by using the clamper 100 by descending the clamping pin 210 through the elevating hole 112c by using the elevator 300.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

What is claimed is:

1. A device for manufacture using a deposition mask, the device comprising:
    a clamper for fixing an end of the deposition mask, the deposition mask having a pin hole, the clamper comprising a top clamper and a bottom clamper;
    a clamping pin in the clamper for being inserted into the pin hole; and
    an elevator for elevating the clamping pin into the pin hole, the elevating being relative to both the top clamper and the bottom clamper.

2. The device of claim 1, wherein the top clamper is configured to contact a top side of the end of the deposition mask; and
    wherein the bottom clamper is configured to contact a bottom side of the end of the deposition mask and has a suction groove for affixing the end of the deposition mask at the bottom clamper.

3. The device of claim 2, wherein the clamping pin is in the suction groove.

4. The device of claim 3, wherein an elevating hole for elevating the clamping pin is at the bottom clamper.

5. The device of claim 4, wherein an inserting groove for receiving the clamping pin is at the top clamper.

6. The device of claim 4, wherein the elevator is coupled to the clamping pin via the elevating hole.

7. The device of claim 3, wherein the suction groove is coupled to a vacuum for affixing the end of the deposition mask.

8. The device of claim 1, wherein the deposition mask comprises a plurality of divided mask sheets.

* * * * *